(12) United States Patent
Anderson

(10) Patent No.: US 10,814,742 B2
(45) Date of Patent: Oct. 27, 2020

(54) SYSTEMS AND METHODS FOR MONITORING VEHICLE POWER SYSTEMS

(71) Applicant: Ford Global Technologies, LLC, Dearborn, MI (US)

(72) Inventor: Richard Dyche Anderson, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 333 days.

(21) Appl. No.: 15/834,810

(22) Filed: Dec. 7, 2017

(65) Prior Publication Data

US 2019/0176638 A1 Jun. 13, 2019

(51) Int. Cl.
| | |
|---|---|
| *B60L 58/16* | (2019.01) |
| *B60L 3/12* | (2006.01) |
| *B60W 10/08* | (2006.01) |
| *B60W 20/15* | (2016.01) |
| *G01R 31/3832* | (2019.01) |
| *G01R 31/3842* | (2019.01) |
| *B60L 53/22* | (2019.01) |

(Continued)

(52) U.S. Cl.
CPC .......... *B60L 58/16* (2019.02); *B60L 3/12* (2013.01); *B60L 53/22* (2019.02); *B60L 58/22* (2019.02); *B60W 10/08* (2013.01); *B60W 20/15* (2016.01); *G01R 31/3647* (2019.01); *G01R 31/3832* (2019.01); *G01R 31/3842* (2019.01); *B60L 2240/526* (2013.01); *B60L 2240/547* (2013.01); *B60Y 2306/15* (2013.01)

(58) Field of Classification Search
CPC .......... B60L 58/16; B60L 58/22; B60L 53/22; B60L 3/12; B60L 2240/526; B60L 2240/547; G01R 31/3647; G01R 31/3832; G01R 31/3842; G01R 31/007; B60W 10/08; B60W 20/15; B60Y 2306/15
See application file for complete search history.

(56) References Cited

U.S. PATENT DOCUMENTS

| | | | |
|---|---|---|---|
| 6,618,681 | B2 | 9/2003 | Hoenig et al. |
| 7,573,241 | B2 | 8/2009 | Anderson et al. |

(Continued)

FOREIGN PATENT DOCUMENTS

| | | |
|---|---|---|
| FR | 2992487 B1 | 8/2014 |
| KR | 101708457 B1 | 2/1917 |
| KR | 101459925 B1 | 11/2014 |

OTHER PUBLICATIONS

Machine Translation of Chauvelier (French Patent 2992487) (Year: 2013).*

(Continued)

*Primary Examiner* — Alan D Hutchinson
(74) *Attorney, Agent, or Firm* — Frank Lollo; Eversheds Sutherland (US) LLP

(57) ABSTRACT

Method and apparatus are disclosed for monitoring a vehicle power supply system having a primary and a secondary power source. An example vehicle includes a primary power source, a secondary power source comprising a low voltage battery, and a processor. The processor is configured for reducing an output of the primary power source, determining an operational characteristic of the low voltage battery while the output of the primary power source is reduced, and providing an alert based on the operational characteristic.

20 Claims, 3 Drawing Sheets

(51) Int. Cl.
*B60L 58/22* (2019.01)
*G01R 31/36* (2020.01)

(56) References Cited

U.S. PATENT DOCUMENTS

| | | |
|---|---|---|
| 8,504,231 B2 | 8/2013 | Kim |
| 9,272,634 B2 | 3/2016 | Li et al. |
| 2009/0206660 A1 | 8/2009 | Makita et al. |
| 2012/0179435 A1 | 7/2012 | Song et al. |
| 2015/0232083 A1 | 8/2015 | Yu et al. |
| 2017/0240064 A1 | 8/2017 | Lee |

OTHER PUBLICATIONS

Machine Translation of Briault (French Patent 3013903) (Year: 2015).*

* cited by examiner

SYSTEMS AND METHODS FOR MONITORING VEHICLE POWER SYSTEMS

TECHNICAL FIELD

The present disclosure generally relates to vehicle electronics and, more specifically, systems and methods for monitoring vehicle power systems.

BACKGROUND

Modern hybrid and fully electric vehicles may include high voltage power supplies, configured to supply high voltage to one or more vehicle systems, such as an electric drive system, a DC/DC converter, and more. These vehicles may also include a low voltage battery (e.g., 12V battery), configured to supply power to one or more vehicle systems such as a virtual driver system for an autonomous vehicle.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown describing systems, apparatuses, and methods for monitoring a vehicle power system including a primary power source and a secondary power source. An example disclosed vehicle includes a primary power source, a secondary power source comprising a low voltage battery, and a processor. The processor is configured for reducing an output of the primary power source, determining an operational characteristic of the low voltage battery while the output of the primary power source is reduced, and providing an alert based on the operational characteristic.

An example disclosed method for monitoring a vehicle power system includes reducing an output of a primary power source of a vehicle power system comprising a primary power source and a secondary power source, wherein the secondary power source comprises a low voltage battery. The method also includes determining an operational characteristic of the low voltage battery while the output of the primary power source is reduced. And the method further includes providing an alert based on the operational characteristic.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
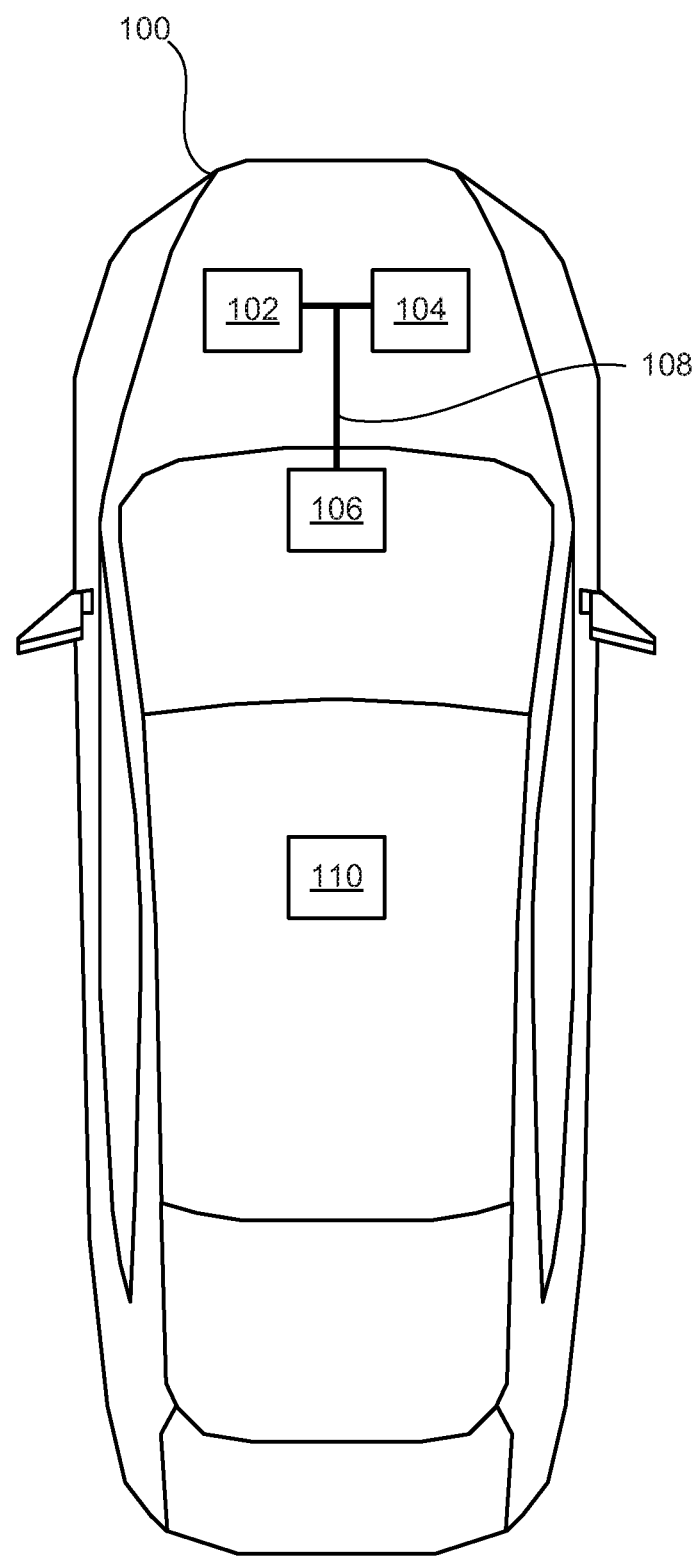
FIG. 1 illustrates an example vehicle having a power system according to embodiments of the present disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

As noted above, modern vehicles, such as hybrid or electric vehicles, may includes two or more power sources to supply power to various loads of the vehicle, such as steering, brakes, displays, etc. For instance, hybrid and all electric vehicles in particular may make use of high voltage power supplies to provide power to the drive train to move the vehicle. Other systems may also make use of the high voltage power, including steering systems, braking systems, and drive control systems.

Some vehicles may also include one or more low voltage power buses configured to control the same vehicle systems (e.g., the steering, brakes, and drive control). Each low voltage power supply bus may include a low voltage battery, which may be a 12 volt rechargeable battery. These batteries may be charged by the high voltage power supply during normal operation of the vehicle.

The high voltage power supply or power source may be configured to be a primary power source, and to supply power to a low voltage bus via a DC/DC converter. The DC/DC converter may take the place of an alternator on a conventional gas power vehicle.

The DC/DC converter may supply power to a low voltage (e.g., 12V) bus, to which a low voltage battery is also connected. This may allow the low voltage battery to be charged by the DC/DC converter, as well as to supply power to the load(s) also coupled to the low voltage bus n the event the primary power source (DC/DC converter) malfunctions or fails.

In most vehicles including a DC/DC converter, when the DC/DC converter fails the vehicle should be immediately taken for service. And where the vehicle is in motion, it should be immediately pulled off the road to avoid a collision, because many of the vehicle system may not operate once the low voltage battery is depleted. When the DC/DC converter fails, the low voltage battery may be required to provide power to the brakes and steering, as well as one or more other emergency systems. As such, in an emergency situation the low voltage battery may be required to provide an atypically high power to the vehicle systems.

It may thus be beneficial to determine whether a given low voltage battery has sufficient capability to provide the needed amount of power to the vehicle systems, before there is an emergency. It may further be beneficial to provide periodic updates and checks on the low voltage battery, so as to alert a driver that the low voltage battery health has degraded and may not be able to provide sufficient power in an emergency situation.

A conventional vehicle may be able to determine when the low voltage battery is degraded by simply failing to start. However, hybrid and electric vehicles may not be able to use this simple test. In hybrid and electric vehicles, the high voltage battery may provide the power to start the engine; and the low voltage battery may only power controllers and contactors, which are a relatively low load. Thus, the low voltage battery status may not be easily determined in these vehicles.

With these issues in mind, example embodiments of the present disclosure may provide systems and methods for monitoring the health of a low voltage battery of a vehicle while the vehicle is operating, so as to provide a more accurate determination of whether the low voltage battery may be able to supply sufficient power in an emergency situation.

Examples disclosed herein may include a vehicle having a primary power source (e.g., DC/DC converter), a secondary power source (E.g., a low voltage rechargeable battery), and a processor. The processor may be configured to determine that one or more vehicle conditions are appropriate for a low voltage battery test. These conditions can include that the battery state of charge, voltage, current, temperature, etc. with within threshold ranges, and many other conditions described herein. If the conditions are right, the processor may be configured to reduce the output of the primary power source, effectively enabling the low voltage battery to supply power to all the loads (e.g., steering, brakes, etc.). The processor may the determine one or more operational characteristics of the low voltage battery, to determine whether the low voltage battery performed sufficiently well that it would be able to provide adequate power in an emergency situation. If the battery did not perform well enough, the processor may provide an alert to the driver of the vehicle to indicate that the low voltage battery may not be healthy enough for an emergency situation.

FIG. 1 illustrates an example vehicle 100 having a vehicle power system according to embodiments of the present disclosure. Vehicle 100 may be any type of vehicle having a primary power source and a secondary power source, including a hybrid vehicle, an electric vehicle, a fuel cell vehicle, or any other mobility implement type of vehicle. Vehicle 100 may be non-autonomous, semi-autonomous, or autonomous. Vehicle 100 may include parts related to mobility, such as a powertrain with an engine, a transmission, a suspension, a driveshaft, and/or wheels, etc. In the illustrated example, vehicle 100 may include one or more electronic components (described below with respect to FIG. 2).

As shown in FIG. 1, the power system of vehicle 100 may include a primary power source 102, a secondary power source 104, and one or more loads 106, all coupled together via a power supply bus 108. The power system may also include a processor 110.

Primary power source 102 may be a DC/DC converter as noted above. In some examples, the primary power source may step down a high voltage battery of vehicle 100 (e.g., 48V or more) to an appropriate voltage level to supply power to the low voltage battery for recharging, as well as to the various loads 106 coupled to the power supply bus 108. This voltage may be between 12-15V.

During typical operation, the primary power source 102 may supply power to the load(s) 106, while the secondary power source 104 acts as a backup to provide a buffer when the current drawn by the load(s) 106 is greater than the primary power source 102 can supply on its own.

Secondary power source 104 may be a low voltage battery (e.g., 12V). The actual output voltage may be higher or lower than 12V, depending on the characteristics of the system and coupled loads. In some examples, the low voltage battery may be recharged by the primary power supply 102 via the power supply bus 108.

When the primary power source 102 fails, the secondary power source 104 may provide power to the load(s) 106, including one or more emergency systems including steering, brakes, lights, virtual driver (in autonomous vehicles), etc.

Load(s) 106 may include the emergency systems such as steering, brakes, etc. Load(s) 106 may also include one or more displays, communication modules, sensors, passenger restraint or safety systems, and more.

Under typical operation conditions of the vehicle 100, where both the primary and secondary power sources are operational, the load(s) 106 may receive power from the primary power source 102. However if the primary power source 102 fails or is reduced, the load(s) 106 may receive power from the secondary power source 104.

Power supply bus 108 may be configured to electrically couple together the primary power source 102 and the secondary power source 104, as well as the load(s) 106. The power supply bus 108 may include two or more power supply buses, even though FIG. 1 illustrates a single power supply bus 108.

Processor 110 may be configured to carry out one or more functions or actions described herein. For instance, processor 100 may be configured to determine one or more vehicle conditions, to determine whether to initiate a test of the low voltage battery. If one or more of the vehicle conditions are met, the processor 110 may responsively initiate a low voltage battery test, which may include one or more of the actions described herein. In particular, the low voltage battery test may include reducing an output of the primary power source, determining an operational characteristic of the low voltage battery while the output of the primary power source is reduced, and providing an alert based on the determined operational characteristic.

In some examples, the vehicle condition may include a low voltage battery state of charge. The processor may determine that the state of charge is above a threshold state of charge, such as 70%, before initiating the test. In some examples the processor 110 may perform the test even if the battery is below the threshold state of charge under certain circumstances. These circumstances may include that the vehicle has just been turned on (i.e., at start up of the vehicle), upon detection of a newly installed battery, and if the loads have been drawing more power than can be supplied by the primary power source alone.

In some examples, the vehicle condition may include a determination that the load(s) 106 are within a threshold range, or are drawing an amount of current within a threshold range (e.g., between 50 and 150 amps). In order to initiate the low voltage battery test the processor 110 may determine that the load(s) 106 draws a sufficient amount of current that there will be a noticeable change in the low voltage battery when it is the only power source (i.e., after the primary power source is reduced), while not drawing so much current that the low voltage battery will not be able to maintain a threshold voltage (e.g., 12V).

In some examples, the vehicle condition may include a determination that the battery temperature is above a threshold temperature, such as 10 degrees Celsius. Other threshold temperatures may be used as well.

In some examples, the vehicle condition may include a determination that the outside temperature is within a threshold range, or that ambient weather conditions are favorable. This may ensure that excessive climate control loads do not interact with the low voltage battery testing. In addition, excessively cold outside temperatures may be avoided to minimize the possibility of snow or ice on the road, to reduce safety concerns during the testing.

One or more vehicle sensors may be used to detect the weather conditions, such as a thermometer, camera, windshield wiper sensors, etc. If the windshield wiper sensor indicates that he wipers are operating, that may indicate that the ambient weather includes rain, in which case a low voltage battery test may be avoided. The vehicle condition may therefore be that there is no rain, and/or that the ambient temperature is above a threshold temperature such as 10 degrees Celsius.

In some examples, the vehicle condition may include a determination that a change in current drawn by the load(s) 106 is predicted to remain within a threshold range for a predetermined duration. For instance, this may include a determination that there will not be any large or significant changes in the load(s) 106 for a five-second period over which the low voltage battery test is completed. It may also include determining or predicting that a large load (such as steering, brakes, etc) will not be needed for the predetermined duration of the low voltage battery test. This may be predicted, for instance, based on a route or guidance system, based on traffic conditions, based on one or more vehicle sensors such as a camera, radar, LIDAR, etc., or more.

In some examples, the vehicle condition may include a determination that a threshold period of time has elapsed after a prior reduction in the output of the primary source. In other words, this may include a determination that an amount of time has elapsed since a prior low voltage battery test, so as not to perform the test too many times in rapid succession. It may be beneficial to perform the low voltage battery test routinely, in order to provide a better indication of the health of the battery. However it may also be beneficial to perform the low voltage battery tests far enough apart in time so as not to unnecessarily degrade the battery health by performing too many tests. The threshold period of time may be, for instance, once per week, two weeks, or more.

In some examples, the vehicle condition may include a determination that there are no faults or issues with the battery already known. If there are issues with the low voltage battery, a test may not be performed.

In some examples, the vehicle condition may include a determination that the vehicle is not in a special operating mode, such as a plant mode. If the vehicle is in a plant mode or manufacturer mode, that may indicate that the vehicle is undergoing maintenance and the low voltage battery test may not be performed.

In some examples, the vehicle condition may include a determination that both batteries in a dual battery low voltage system are connected.

If one or more of the vehicle conditions above are met, the processor may responsively initiate the low voltage battery test by reducing the output of the primary power source 102.

In some examples, reducing the output of the primary power source 102 may include reducing a maximum output current of the primary power source 102. The DC/DC converter may be limited so that its output current is limited to less than its maximum output. For instance, where the DC/DC converter is configured to supply between 150-200 A under normal conditions, the output current may be limited to 100 A, or any other value less than the maximum output amount. This may have the effect of causing the low voltage battery to be discharged through providing power to the loads 106.

In some examples, reducing the output of the primary power source 102 may include reducing a voltage set point of the DC/DC converter. Under normal conditions, the DC/DC converter may be configured to provide a voltage of between 13-15V depending on the temperature of the low voltage battery, in order to maintain the low voltage battery state of charge at a high state of charge, possibly 75% to 100%. Reducing the voltage set point may cause the low voltage battery to discharge based on the amount of attached load 106. A reduced voltage set point may also cause the low voltage battery to fail prematurely.

Further, in some examples reducing the output of the primary power source may include a combination of reducing the maximum current output level as well as the voltage set point.

The processor may further be configured to ensure that the voltage of the power supply bus 108 does not drop below a threshold level, such as 12V. As such, the reduction in power output of the primary power source 102 may be maintained above a threshold floor level, to ensure that in an emergency situation the vehicle still has enough power to safely steer and/or stop.

Processor 110 may also be configured for determining an operational characteristic of the low voltage battery while the output of the primary power source is reduced. The operational characteristic may include a power capability of the low voltage battery, such as a current and voltage.

In some examples, determining the operational characteristic may include determining the current drawn by the load(s) 106 from the low voltage battery, determining a voltage output of the low voltage battery, and determining an open circuit voltage. Where the current drawn is greater than 50 A, for example, the voltage supplied should be greater than a threshold amount. And further, the difference between the open circuit voltage and the voltage while supplying greater than 50 A (i.e., the voltage drop caused by the load(s) 106) should be less than a threshold amount.

The measured voltage and current may be used by processor 110 to determine that the battery has either a sufficient or insufficient power supply capacity. While embodiments disclosed herein include determining the voltage and current of the battery and comparing to an open circuit voltage, other techniques for determining a power supply capacity of the low voltage battery may be used as well. For instance, the techniques described in U.S. patent application Ser. No. 12/987,190 may be used, which is herein incorporated by reference.

In some examples, the processor 110 may be configured to analyze the determined operational characteristic(s) of the low voltage battery, to determine whether the low voltage battery can supply sufficient power in an emergency. Alternatively, the operational characteristics may be transmitted to a cloud based server or remote computing system for analysis. The remote computing system may determine that the low voltage battery cannot supply sufficient power, and may then responsively transmit an alert to the vehicle 100.

Whether the analysis is performed by the processor 110 or the remote computing device, the processor may be configured to provide an alert to a driver or passenger of the vehicle 100 indicating that the health of the battery, based on the operational characteristic. For instance, where the battery health is determined to be sufficient to provide power in an emergency situation, the processor 110 may provide an alert indicating that the low voltage battery is healthy. But where it is determined that the low voltage battery cannot provide sufficient power, the alert may indicate that a new battery should be installed. The alert may be displayed on a vehicle display, and can include a visual, auditory, or haptic alert. In some examples, an alert may be sent to a remote computing device corresponding to the vehicle, such as a phone or other device of an owner of the vehicle. Further, in some examples the processor 110 may be configured to set an appropriate diagnostic code indicating that the battery health is degraded.

In some examples, the chemistry of the low voltage battery itself may affect the analysis. For instance, if the low voltage battery is a lithium iron phosphate (LFP) battery, it may have a very flat open circuit voltage and state of charge curve, making it more uncertain whether the state of charge is above a threshold or not. As such, if this battery is determined to have failed to provide sufficient power, it may be due to a low actual initial state of charge that was deemed high enough based on an error margin. Where a battery is determined to have failed, additional tests may be performed to ensure the accuracy of any measurement or determination. The additional tests may be performed based on the same vehicle condition(s) or different vehicle conditions. In addition, a failed test may cause one or more diagnostic codes to be set, warning lights to be turned on, messages to be sent to a driver, manufacturer, or other party, or one or more other actions to be taken.

Further, some dual battery systems may require different operational characteristics based on a difference in decay rates, battery temperatures, etc. between the batteries. In the event a dual battery system is used, an important factor may be the combined power output. As such, the combined output may be used to determine the health of the power system, and it may not be material whether a first battery or second battery provides more or less power than the other.

Figure 2:
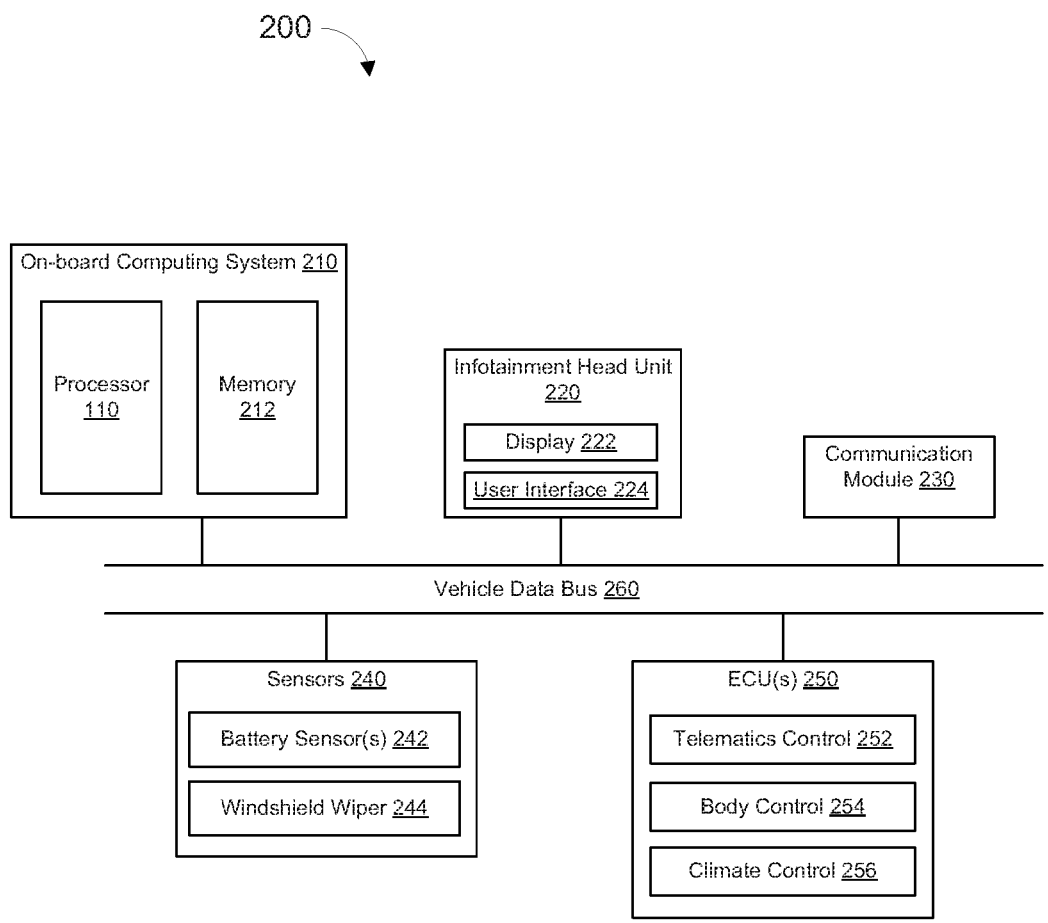
FIG. 2 illustrates an example block diagram of electronic components of the vehicle of FIG. 1.

FIG. 2 illustrates an example block diagram 200 showing electronic components of vehicle 100, according to some embodiments. In the illustrated example, the electronic components 200 include the on-board computing system 210, infotainment head unit 220, communication module 230, sensors 240, electronic control unit(s) 250, and vehicle data bus 260.

The on-board computing system 210 may be a collection of ECUs, having one or more processors, memory, and other components. The on-board computing system 210 may include a microcontroller unit, controller or processor 110 and memory 212. Processor 110 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory 212 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory 212 includes multiple kinds of memory, particularly volatile memory and non-volatile memory.

The memory 212 may be computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 212, the computer readable medium, and/or within the processor 110 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The infotainment head unit 220 may provide an interface between vehicle 100 and a user. The infotainment head unit 220 may include a user interface 224 having one or more input and/or output devices. The input devices may include, for example, a control knob, an instrument panel, a digital camera for image capture and/or visual command recognition, a touch screen, an audio input device (e.g., cabin microphone), buttons, or a touchpad. The output devices may include instrument cluster outputs (e.g., dials, lighting devices), actuators, a heads-up display, a center console display (e.g., a liquid crystal display (LCD), an organic light emitting diode (OLED) display, a flat panel display, a solid state display, etc.), and/or speakers. In the illustrated example, the infotainment head unit 220 includes hardware (e.g., a processor or controller, memory, storage, etc.) and software (e.g., an operating system, etc.) for an infotainment system (such as SYNC® and MyFord Touch® by Ford®, Entune® by Toyota®, IntelliLink® by GMC®, etc.). In some examples the infotainment head unit 220 may share a processor with on-board computing system 210. Additionally, the infotainment head unit 220 may display the infotainment system on, for example, a center console display 222 of vehicle 100. In some examples, the alert indicating the low voltage battery health statues may be shown on display 222. This may provide a driver or passenger with information so as to safely stop the vehicle and/or take the vehicle to get maintenance or repairs completed. In addition, the appropriate diagnostics trouble code(s) would be set (in accordance with ISO 14229, ISO 15031-6/SAE J2012™, and other automotive standards) to aid the service technician in pinpointing the source of the issue.

Communication module 230 may be configured to transmit and receive data with one or more remote computing devices. As such, communication module 230 may be configured to communicate using any available communication protocol. Communication module 230 may be a specialized module, or may be distributed through two or more modules. For instance, the communication module 230 may include a cellular modem, Wi-Fi, Bluetooth, satellite, USB, or other communication mechanism.

Sensors 240 may be arranged in and around the vehicle 100 in any suitable fashion. In the illustrated example, sensors 240 include one or more battery sensors 242, and a windshield wiper sensor 244. Other sensors may be included as well.

The ECUs 250 may monitor and control subsystems of vehicle 100. ECUs 250 may communicate and exchange information via vehicle data bus 260. Additionally, ECUs 250 may communicate properties (such as, status of the ECU 250, sensor readings, control state, error and diagnostic codes, etc.) to and/or receive requests from other ECUs 250. Some vehicles 100 may have seventy or more ECUs 250 located in various locations around the vehicle 100 communicatively coupled by vehicle data bus 260. ECUs 250 may be discrete sets of electronics that include their own circuit(s) (such as integrated circuits, microprocessors, memory, storage, etc.) and firmware, sensors, actuators, and/or mounting hardware. In the illustrated example, ECUs 250 may include the telematics control unit 252, the body control unit 254, and the climate control unit 256.

The telematics control unit 252 may control tracking of the vehicle 100, for example, using data received by a GPS receiver and/or one or more sensors. The body control unit 254 may control various subsystems of the vehicle 100. For example, the body control unit 254 may control power a trunk latch, windows, power locks, power moon roof control, an immobilizer system, and/or power mirrors, etc. The climate control unit 256 may control the speed, temperature, and volume of air coming out of one or more vents. The climate control unit 256 may also detect the blower speed (and other signals) and transmit to the on-board computing system 210 via data bus 260. Other ECUs are possible as well.

Vehicle data bus 260 may include one or more data buses that communicatively couple the on-board computing system 210, infotainment head unit 220, communication module 230, sensors 240, ECUs 250, and other devices or systems connected to the vehicle data bus 260. In some examples, vehicle data bus 260 may be implemented in accordance with the controller area network (CAN) bus protocol as defined by International Standards Organization (ISO) 11898-1. Alternatively, in some examples, vehicle data bus 260 may be a Media Oriented Systems Transport (MOST) bus, or a CAN flexible data (CAN-FD) bus (ISO 11898-7).

Figure 3:
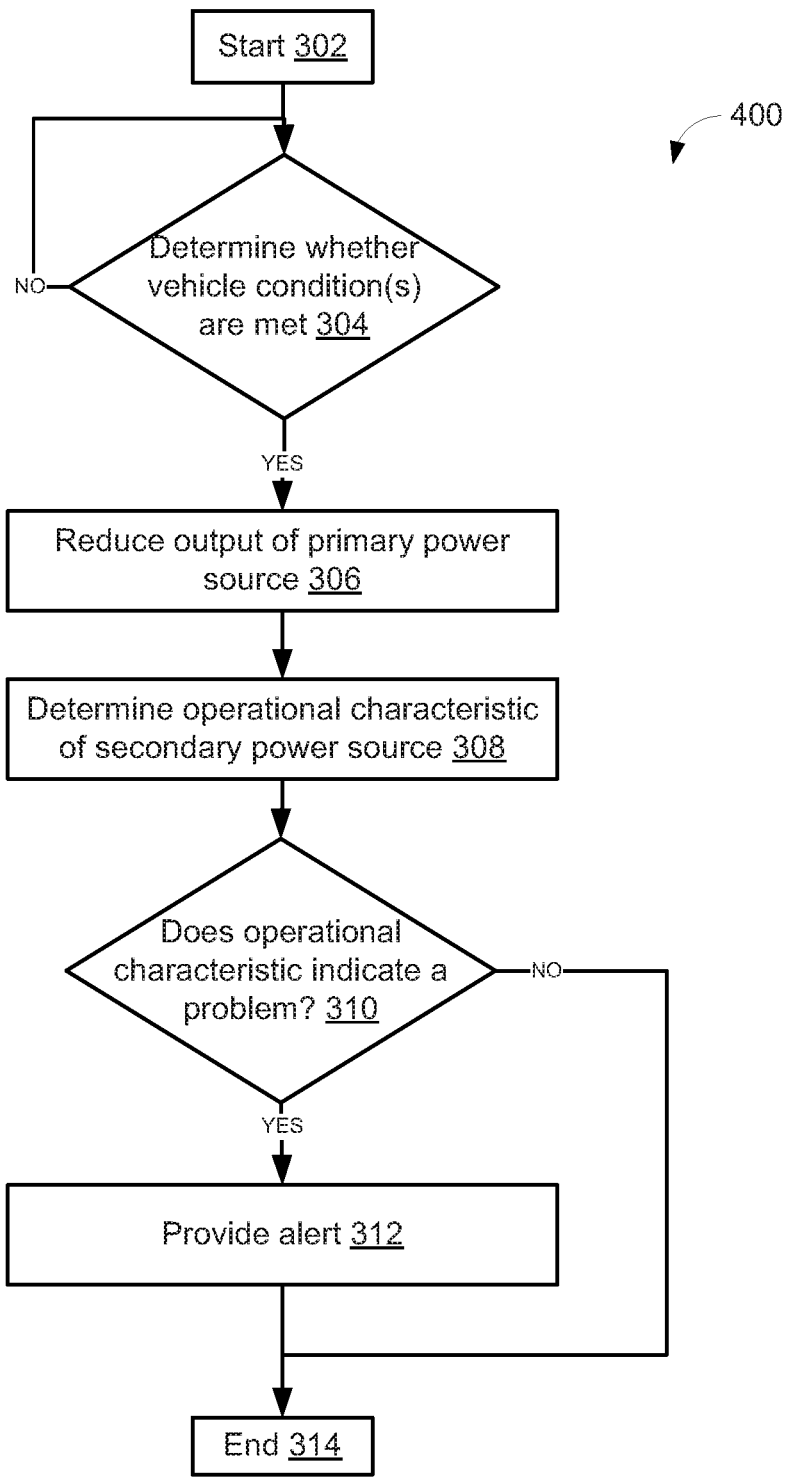
FIG. 3 illustrates a flowchart of an example method according to embodiments of the present disclosure.

FIG. 3 illustrates a flowchart of an example method 300 according to embodiments of the present disclosure. Method 300 may enable a vehicle power system to monitor and test a low voltage battery, to ensure that it can supply a sufficient power to vehicle systems in an emergency situation. The flowchart of FIG. 3 is representative of machine readable instructions that are stored in memory (such as memory 212) and may include one or more programs which, when executed by a processor (such as processor 110) may cause vehicle 100 and/or one or more systems or devices to carry out one or more functions described herein. While the example program is described with reference to the flowchart illustrated in FIG. 3, many other methods for carrying out the functions described herein may alternatively be used. For example, the order of execution of the blocks may be rearranged or performed in series or parallel with each other, blocks may be changed, eliminated, and/or combined to perform method 300. Further, because method 300 is disclosed in connection with the components of FIGS. 1-2, some functions of those components will not be described in detail below.

Method 300 may start at block 302. At block 304, method 300 may include determining whether one or more vehicle conditions are met. The vehicle conditions may be any conditions described herein with respect to FIG. 1, including the battery state of charge, temperature, ambient conditions, etc.

At block 306, method 300 may reducing the output of the primary power source. This may include reducing a maximum current output, reducing a voltage set point, performing a combination of the two, or taking some other action.

At block 308, method 300 may include determining an operational characteristic of the secondary power source. This may include determining a voltage and current response of the secondary power source while the primary power source is reduced.

At block 310, method 300 may include determining whether the operational characteristic indicates that there is a health problem with the secondary power source. If there is a problem indicated, method 300 may include providing an alert at block 312. Method 300 may then end at block 314.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle power system comprising:
   a primary power source, wherein the primary power source provides power to a vehicle load during operation of the vehicle;
   a secondary power source comprising a low voltage battery; and
   a processor configured for:
      reducing, while the vehicle is in motion, an output of the primary power source;
      providing, subsequent to reducing the output of the primary power source and while the vehicle is in motion, power to the vehicle load through the low voltage battery;
      determining, based on providing power to the vehicle load through the low voltage battery, an operational characteristic of the low voltage battery, the operational characteristic comprising a determination that a voltage or current of the low voltage battery is unable to provide sufficient power to the vehicle load; and
      providing an alert based on the operational characteristic.

2. The vehicle power system of claim 1, wherein the primary power source comprises a DC/DC converter.

3. The vehicle power system of claim 1, wherein the primary power source and the secondary power source are coupled to a power supply bus, the vehicle power system further comprising a load coupled to the power supply bus.

4. The vehicle power system of claim 3, wherein reducing the output of the primary power source is based on a determination that a vehicle condition is met.

5. The vehicle power system of claim 4, wherein the vehicle condition comprises a determination that a temperature of the low voltage battery is above a threshold.

6. The vehicle power system of claim 4, wherein the vehicle condition comprises a determination that the vehicle is not in a special operating mode, a determination that the primary power source and low voltage battery are connected, a determination that an outside temperature is within a threshold range, or a determination that there is no fault associated with the low voltage battery.

7. The vehicle power system of claim 4, wherein the vehicle condition comprises a determination that the low voltage battery is above a threshold state of charge.

8. The vehicle power system of claim 4, wherein the vehicle condition comprises a determination that a current drawn by the load is within a threshold range.

9. The vehicle power system of claim 8, wherein the vehicle condition further comprises a determination that a change in the current drawn by the load is predicted to remain within the threshold range for a predetermined duration while the output of the primary power source is reduced.

10. The vehicle power system of claim 4, wherein the vehicle condition comprises a determination that a threshold period of time has elapsed after a prior reduction in the output of the primary power source.

11. The vehicle power system of claim 1, wherein reducing the output of the primary power source comprises reducing both a maximum current output level and voltage set point of the primary power source.

12. The vehicle power system of claim 1, wherein the operational characteristic further comprises a power capability of the low voltage battery determined based on a measured low voltage battery current and voltage.

13. A method for monitoring a vehicle power system comprising:
reducing, while the vehicle is in motion, an output of a primary power source of the vehicle power system comprising the primary power source, a secondary power source, and a processor, wherein the secondary power source comprises a low voltage battery, wherein the primary power source provides power to a vehicle load during operation of the vehicle;
providing, subsequent to reducing the output of the primary power source and while the vehicle is in motion, power to the vehicle load through the low voltage battery;
determining, based on providing power to the vehicle load through the low voltage battery, an operational characteristic of the low voltage battery, the operational characteristic comprising a determination that a voltage or current of the low voltage battery is unable to provide sufficient power to the vehicle load; and
providing an alert based on the operational characteristic.

14. The method of claim 13, wherein the primary power source and the secondary power source are coupled to a power supply bus, the vehicle power system further comprising a load coupled to the power supply bus.

15. The method of claim 14, wherein reducing the output of the primary power source is based on a determination that a vehicle condition is met.

16. The method of claim 15, wherein the vehicle condition comprises a determination that the low voltage battery is above a threshold state of charge.

17. The method of claim 15, wherein the vehicle condition comprises a determination that a current drawn by the load is within a threshold range.

18. The method of claim 17, wherein the vehicle condition further comprises a determination that a change in the current drawn by the load is predicted to remain within the threshold range for a predetermined duration while the output of the primary power source is reduced.

19. The method of claim 15, wherein the vehicle condition comprises a determination that a threshold period of time has elapsed after a prior reduction in the output of the primary power source.

20. The method of claim 13, wherein reducing the output of the primary power source comprises reducing both a maximum current output level and voltage set point of the primary power source.

* * * * *